United States Patent
Bedell et al.

(10) Patent No.: US 9,293,476 B2
(45) Date of Patent: Mar. 22, 2016

(54) INTEGRATING ACTIVE MATRIX INORGANIC LIGHT EMITTING DIODES FOR DISPLAY DEVICES

(71) Applicant: International Business Machines Corporation, Armonk, NY (US)

(72) Inventors: Stephen W. Bedell, Wappingers Falls, NY (US); Bahman Hekmatshoartabari, Yorktown Heights, NY (US); Devendra K. Sadana, Pleasantville, NY (US); Ghavam G. Shahidi, Pound Ridge, NY (US); Davood Shahrjerdi, White Plains, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/518,023

(22) Filed: Oct. 20, 2014

(65) Prior Publication Data

US 2015/0102359 A1    Apr. 16, 2015

Related U.S. Application Data

(62) Division of application No. 13/303,486, filed on Nov. 23, 2011, now Pat. No. 8,912,020.

(51) Int. Cl.
*H01L 27/12* (2006.01)
*H01L 27/15* (2006.01)
*H01L 33/00* (2010.01)

(52) U.S. Cl.
CPC .......... *H01L 27/1218* (2013.01); *H01L 27/156* (2013.01); *H01L 33/0079* (2013.01)

(58) Field of Classification Search
CPC ......... H01L 33/32; H01L 33/08; H01L 33/58; H01L 27/1218; H01L 27/156; H01L 33/0079
USPC .................. 257/59, 72, 76, E33.025, E33.071
See application file for complete search history.

(56) References Cited

U.S. PATENT DOCUMENTS

| | | | |
|---|---|---|---|
| 7,381,579 B2 | 6/2008 | Suh et al. |
| 7,538,017 B2 | 5/2009 | Kim et al. |
| 2008/0050888 A1 | 2/2008 | Garner et al. |
| 2008/0193798 A1 | 8/2008 | Lemon et al. |
| 2008/0308820 A1 | 12/2008 | Louwsma et al. |

(Continued)

FOREIGN PATENT DOCUMENTS

| | | |
|---|---|---|
| EP | 2341543 A1 | 7/2011 |
| WO | 2005099310 A2 | 10/2005 |

(Continued)

OTHER PUBLICATIONS

H.W. Choi et al., "GaN Micro-Light-Emitting Diode Arrays with Monolithically Integrated Sapphire Microlenses," Applied Physics Letters; vol. 84; No. 13, pp. 2253-2255; Mar. 2004.

(Continued)

*Primary Examiner* — Selim Ahmed
(74) *Attorney, Agent, or Firm* — Cantor Colburn LLP

(57) ABSTRACT

A method of forming an active matrix, light emitting diode (LED) array includes removing, from a base substrate, a layer of inorganic LED material originally grown thereupon; and bonding the removed layer of inorganic LED material to an active matrix, thin film transistor (TFT) backplane array.

13 Claims, 9 Drawing Sheets

(56) References Cited

U.S. PATENT DOCUMENTS

| | | |
|---|---|---|
| 2009/0008667 A1 | 1/2009 | Fujii et al. |
| 2009/0109435 A1* | 4/2009 | Kahen et al. ............... 356/317 |
| 2009/0130600 A1 | 5/2009 | Irving et al. |
| 2010/0090595 A1* | 4/2010 | Nomura et al. ............. 313/506 |
| 2010/0272933 A1 | 10/2010 | McCormick et al. |
| 2010/0304048 A1 | 12/2010 | Yukinobu et al. |
| 2010/0311250 A1 | 12/2010 | Bedell et al. |
| 2010/0317132 A1* | 12/2010 | Rogers et al. ............... 438/27 |
| 2011/0012118 A1 | 1/2011 | Yamazaki et al. |
| 2011/0193834 A1 | 8/2011 | Nathan et al. |

FOREIGN PATENT DOCUMENTS

| | | | |
|---|---|---|---|
| WO | 2008143635 | A1 | 11/2008 |
| WO | 2009089105 | A1 | 7/2009 |
| WO | 2010046641 | A2 | 4/2010 |
| WO | 2010051106 | A2 | 5/2010 |
| WO | 2011071559 | A4 | 6/2011 |

OTHER PUBLICATIONS

Intellectual Property Office; GB Search Report; Application No. GB1220562.1; Patents Act 1977: Combined Search and Examination Report under Sections 17 and 18(3); Date Mailed: Feb. 19, 2013; pp. 1-6.

K.R. Sarma et al., "Active Matrix OLED Using 150 C a-Si TFT Backplane Built on Flexible Plastic Substrate," SPIE Symp. on Aerospace/Defense Sensing, vol. 5080, paper 24, pp. 1-12; 2003.

Zhao Jun Liu et al., "GaN Based Active Matrix Light Emitting Diode Array by Flip-Chip Technology," Optical Society of America; Optical Fiber Communication & Optoelectronic Exposition and Conference; pp. 1-3; 2008.

Zhao Jun Liu et al., "GaN-based Monolithic LED Micro-arrays," The 14th Optoelectronics and Communications Conference, Jul. 2009, p. 1-2.

* cited by examiner

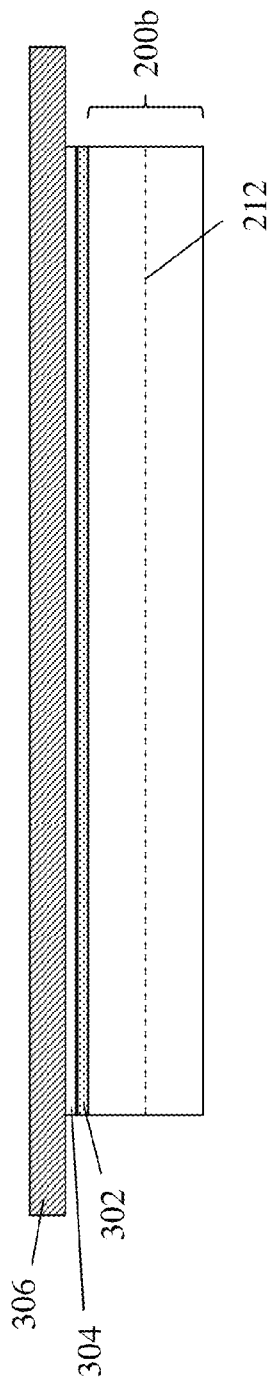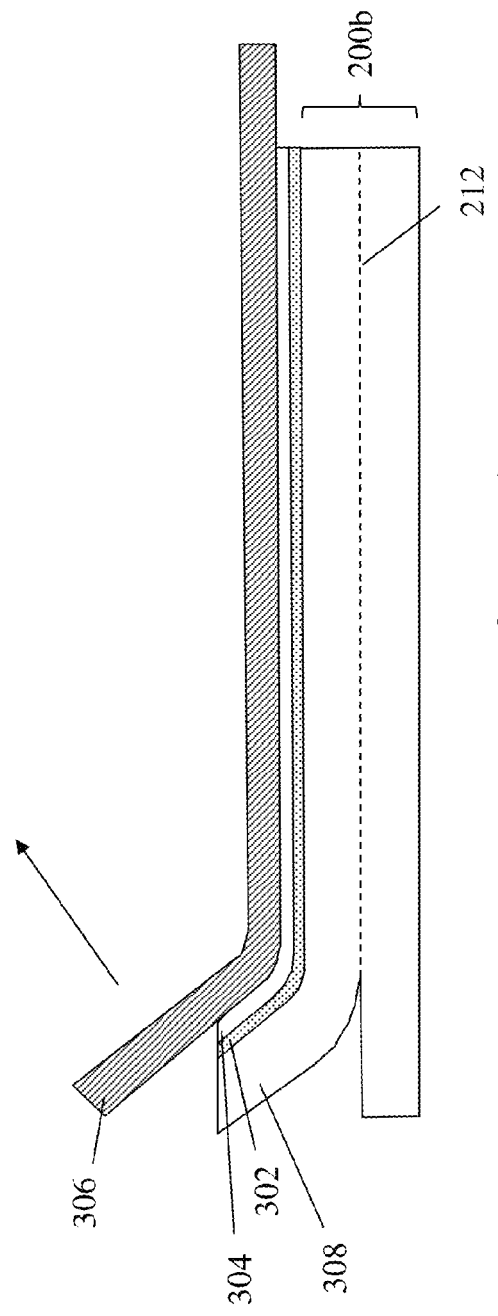
Figure 3
Figure 4

INTEGRATING ACTIVE MATRIX INORGANIC LIGHT EMITTING DIODES FOR DISPLAY DEVICES

DOMESTIC PRIORITY

This application is a divisional of U.S. patent application Ser. No. 13/303,486, filed Nov. 23, 2011, the disclosure of which is incorporated by reference herein in its entirety.

BACKGROUND

The present invention relates generally to semiconductor device manufacturing and, more particularly, to methods of integrating active matrix, inorganic light emitting diodes for display devices.

Organic light emitting diode (OLED) displays have gained significant interest recently in flat panel display applications in view of their faster response times, larger viewing angles, higher contrast, lighter weight, lower power, amenability to flexible substrates, as compared to liquid crystal displays (LCDs). Despite the OLED's demonstrated superiority over the LCD, there still remain several challenging issues related to encapsulation and lifetime, yield, color efficiency, and drive electronics, all of which are receiving considerable attention.

Nonetheless, OLEDs continue to be widely investigated as a future technology choice for manufacturing flexible active matrix displays. Although passive matrix addressed OLED displays are already in the marketplace, they do not support the resolution needed in the next generation displays, since high information content (HIC) formats are only possible with the active matrix addressing scheme. Active-matrix refers to the combination of the switching and/or driving active devices (typically thin-film transistors) and the passive devices (such as LEDs) controlled by the active devices. The active and passive parts of the active matrix are typically referred to as the backplane and front plane, respectively.

In contrast to the more established inorganic LEDs, the low deposition temperature of organic materials is well compatible with low-cost flexible substrates. On the other hand, the lifetime and efficiency of currently existing organic LEDs is far below that of the inorganic LEDs.

SUMMARY

In an exemplary embodiment, a method of forming an active matrix, light emitting diode (LED) array includes removing, from a base substrate, a layer of inorganic LED material originally grown thereupon; and bonding the removed layer of inorganic LED material to an active matrix, thin film transistor (TFT) backplane array.

In another embodiment, a method of forming a display device includes growing one or more layers of inorganic light emitting diode (LED) material on a base substrate; separating the one or more layers of the inorganic LED material from the base substrate by a stress-induced spalling technique; and bonding the separated one or more layers of inorganic LED material to an active matrix, thin film transistor (TFT) backplane array, thereby defining an active matrix LED array.

In another embodiment, an active matrix, light emitting diode (LED) array includes a layer of inorganic LED material bonded to an active matrix, thin film transistor (TFT) backplane array.

BRIEF DESCRIPTION OF THE SEVERAL VIEWS OF THE DRAWINGS

Referring to the exemplary drawings wherein like elements are numbered alike in the several Figures:

FIG. 3 is a cross sectional view illustrating the formation of one or more stress layers and a flexible handle layer on a grown, inorganic LED device;

FIG. 4 is a cross sectional view illustrating mechanical force induced spalling of the LED device along a fracture plane by lifting of the stress layer(s) via the flexible handle layer;

DETAILED DESCRIPTION

Disclosed herein is a method of integrating inorganic light emitting diodes (LEDs) onto a thin-film transistor (TFT) backplane for realizing active matrix LED displays on substrates, whether flexible or rigid substrates. In brief, the embodiments herein utilize a stress-induced, substrate spalling technique to transfer a layer of a conventionally grown, inorganic LED device onto an integrated TFT backplane using a mechanical bonding technique (such as cold welding, for example) to create an active matrix, inorganic LED array. Previously, any practical approach to integrating LED devices with TFT backplane substrates was through the low temperature deposition of the aforementioned organic LED material.

Figure 1:
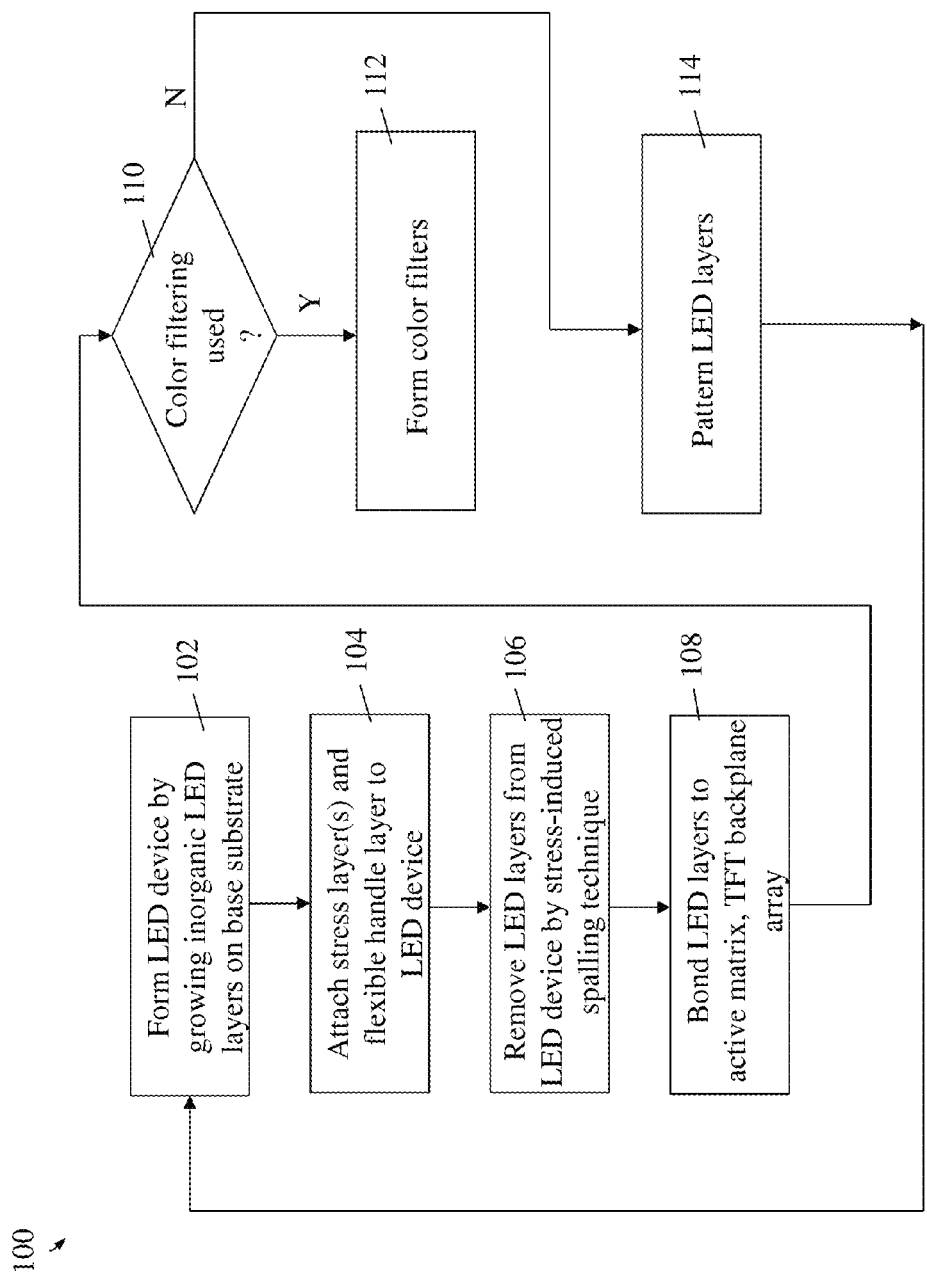
FIG. 1 is a flow diagram illustrating a method of forming an active matrix, inorganic LED array in accordance with an exemplary embodiment.

Referring initially to FIG. 1, there is shown a flow diagram illustrating a method 100 of forming an active matrix, inorganic LED array in accordance with an exemplary embodiment. FIG. 1 may be referenced again later as specific operations depicted in the flow diagram blocks are described in further detail by way of the additional figures. As shown in block 102, an LED device is formed by growing inorganic LED layers on a base substrate. This initial LED device formation may be formed in accordance with techniques known in the art, such as by forming, for example, a gallium nitride (GaN) LED structure on a base sapphire substrate. Then, as indicated in block 108, the LED layers (e.g., p-type layer/active layer/n-type layer) comprising the LED device are removed from the base substrate upon which they were grown by a stress-induced spalling technique. The LED layers thus transferred from the base substrate by spalling are then bonded to an active matrix, TFT backplane array as shown in block 108, such as by cold welding.

For a display device having large numbers of colored subpixels, it is contemplated that the single planar LED device bonded to the backplane array may be provided with individual color filters. As indicated in decision block 110, where color filtering is to be used, color filters are formed as shown in block 112. On the other hand, if color filters are not used, another option is to pattern (e.g., through conventional lithography) the LED layers of a first semiconductor type, as depicted in block 114. Thereafter, the LED growth/spalling/bonding/patterning processing may be repeated (i.e., the process loops back to block 102) to create an adjacent subpixel with a different light emission color. Also in the case where color filters are to be formed, the transferred LED layers could also be patterned to improve the mechanical flexibility of the active matrix in case a flexible TFT backplane array is used.

Figure 2:
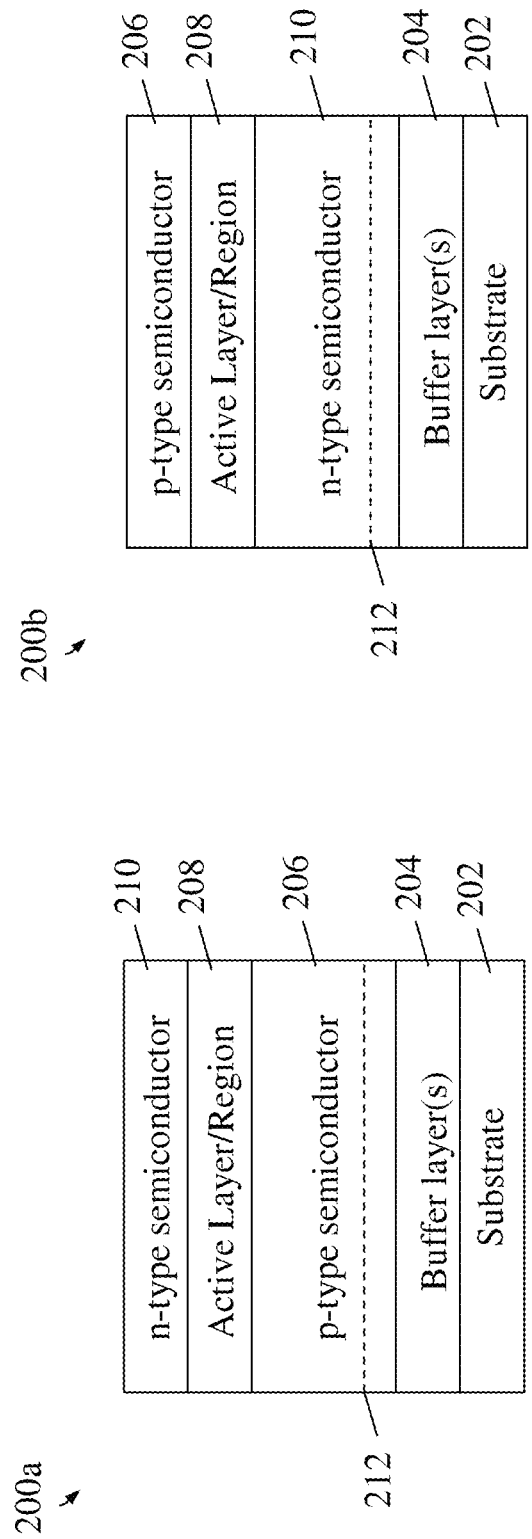
FIG. 2(a) is a cross sectional view of a grown, inorganic LED device used in the method of FIG. 1.
FIG. 2(b) is a cross sectional view of an alternative embodiment of the grown, inorganic LED device of FIG. 2(a)

FIGS. 2(*a*) and 2(*b*) illustrate exemplary embodiments of an LED device 200*a*, 200*b*, respectively, in further detail. As is shown, the LED device 200*a* of FIG. 2(*a*) includes a base substrate 202 (e.g., sapphire) upon which an optional buffer layer or layers 204 (e.g., aluminum nitride) may be formed. A p-type doped semiconductor layer 206 (e.g., GaN) is formed on the buffer layer(s) 204, an active layer or region 208 (e.g., InGaN) is formed on the p-type doped semiconductor layer 206, and an n-type doped semiconductor layer 210 (e.g., GaN) is formed on the active layer 208. The dashed line 212 represents the desired location where the LED layers are spalled so as to be removed from the base substrate 202 and buffer layer(s) 204. In the LED device 200*b* of FIG. 2(*b*), the polarity of the LED is merely reversed, in that n-type doped semiconductor layer 210 is formed on the buffer layer(s) 204, followed by the active layer 208 and p-type doped semiconductor layer 206.

Referring now to FIG. 3, there is shown a cross sectional view of illustrating the formation of one or more stress layers and a flexible handle layer on a grown, inorganic LED device. In this example, the LED device 200*b* of FIG. 2(*b*) is illustrated as an exemplary source substrate for the spalling process thereof. In particular, one or more thin, low-cost stressor layers (optional adhesion layer 302 and metal layer 304) are deposited on the source (LED) substrate 200*b*. A flexible handle layer 306 is then attached to the metal stressor layer 304.

The optional adhesion layer 302 may be formed from a metal such as, for example, titanium (Ti), tungsten (W), chromium (Cr), nickel (Ni), and alloys thereof. The metal stress layer 304 may include a metal such as Ni, Cr and iron (Fe) formed opposite an interface between the adhesion layer 302 and the source substrate 200*b*. The flexible handle layer 306 (such as a polyimide for example) has a suitable radius of curvature such that the handle layer 306 is not too rigid so as to compromise the spalling process.

Thicknesses of the thin stressor layer or layers 302, 304, singly, or in combination are selected so as to prevent spontaneous spalling of the source substrate 200*b* simply due to the deposition of the stressor layers themselves. Rather, it is intended that the spalling process be performed in a controlled manner such that application of a mechanical force on handle layer 306 results exfoliation of a portion of the LED source substrate along the intended location 212, as shown in FIG. 4. In one exemplary embodiment, the thickness of the exfoliated semiconductor layer 304 from the source substrate 200*b* is roughly twice the thickness of the combined thicknesses of the stressor layer 304 and the optional adhesion layer 302. By controlling the amount of strain in the stressor layer 304, the operable thickness value of the stressor layer 304 can be chosen to remove a controlled thickness of the exfoliated LED semiconductor layers 308.

Figure 5:
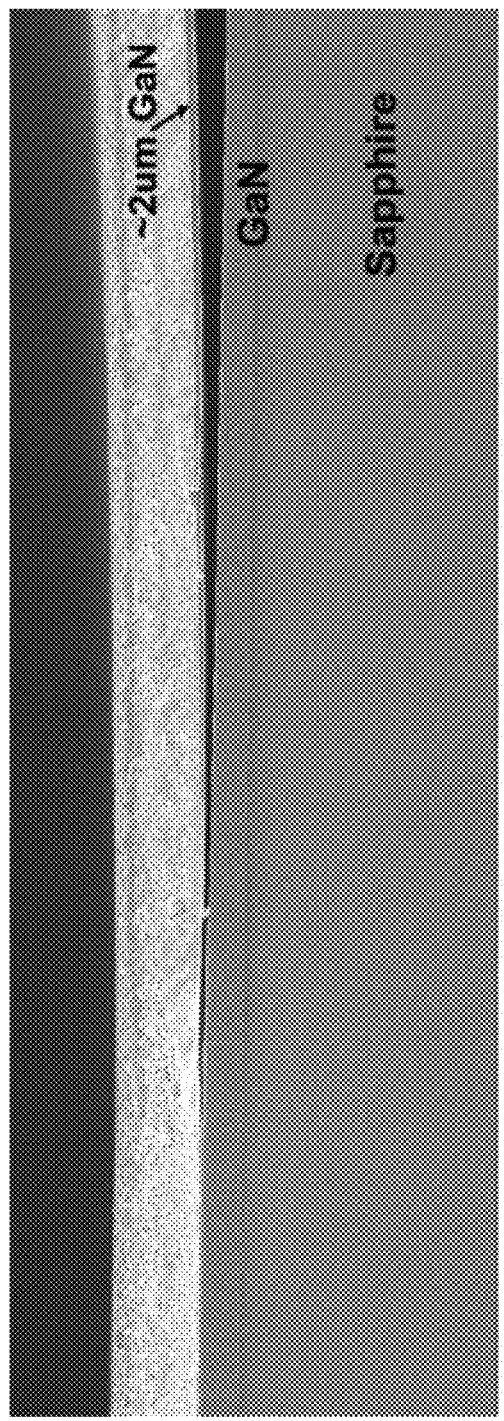
FIG. 5 is a scanning electron micrograph (SEM) image demonstrating a semiconductor layer spalling technique.

By way of further illustration, FIG. 5 is a scanning electron micrograph (SEM) image demonstrating a semiconductor layer spalling technique, in which approximately a 2 micron (μm) thick GaN layer of is released from a GaN LED structure grown on a sapphire substrate. Additional details regarding controlled semiconductor layer spalling using a metal stressor layer(s) and handle layer may be found in published application U.S. 2010/0311250, assigned to the assignee of the present application, and the contents of which are incorporated herein in their entirety.

Figure 6:
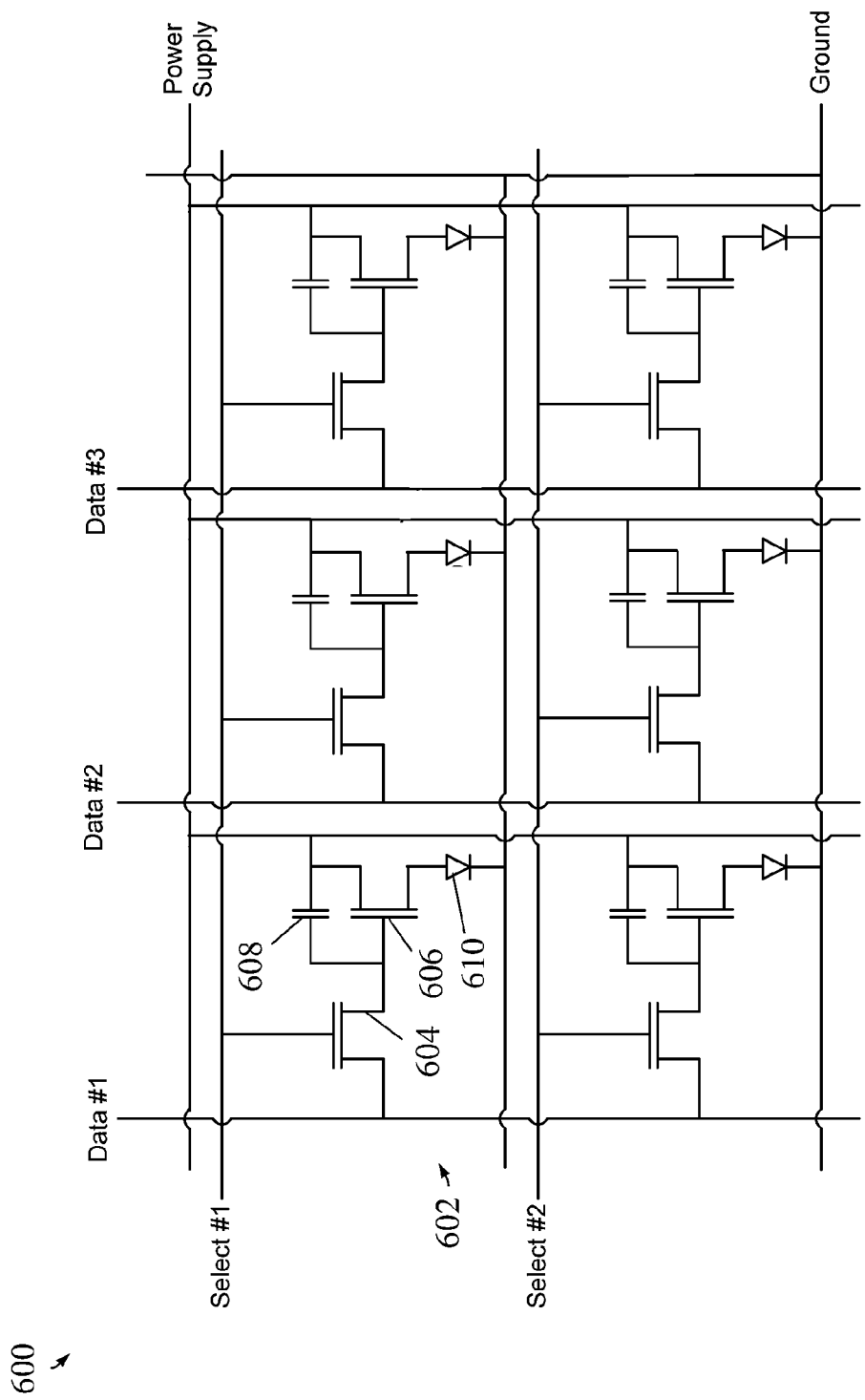
FIG. 6 is a schematic diagram illustrating an active matrix, TFT backplane array to which the spalled LED layers of the LED device may be bonded.

With respect to the TFT backplane array to which removed LED device layer may be bonded, FIG. 6 is a schematic diagram illustrating an active matrix, TFT backplane array 600 to which the spalled LED layers of the LED device may be bonded. While it will be understood that an actual LED array will have many more pixel structures, the illustrative array 600 is depicted as a 3×2 active-matrix LED array with a 2-TFT pixel structure. Each pixel 602 includes, for example, a switching TFT 604, a driver TFT 606, a storage capacitor 608 and an LED 610, in its simplest form. Other backplane designs, such as those used for active-matrix OLED displays, may also be utilized as well.

Figure 7:
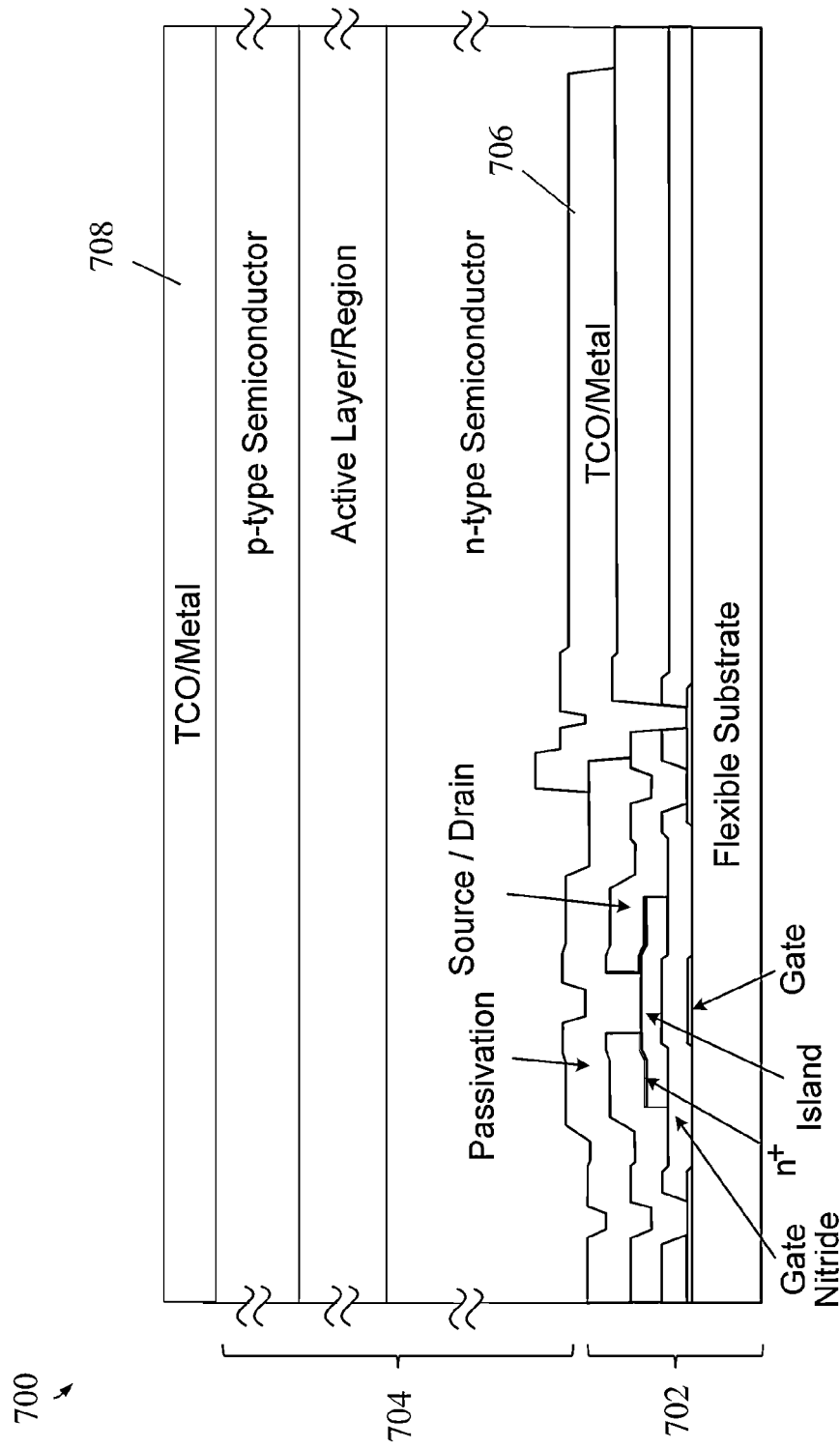
FIG. 7 is a cross sectional view illustrating mechanical bonding of spalled inorganic LED device to an active matrix TFT backplane array.

Referring now to FIG. 7, there is shown a cross sectional view illustrating mechanical bonding of spalled inorganic LED device to an active matrix TFT backplane so as to define an active matrix LED array 700. In the embodiment shown, the active matrix TFT backplane is generally indicated at 702, and the LED device bonded thereto is generally indicated at 704. Again, the specific polarity of the illustrated LED 704 is only exemplary in nature. As further depicted in FIG. 7, the array 700 also includes a contact (bottom) electrode 706 used to contact the driver TFT in the backplane 702 to the LED 704. The contact electrode 706 may be a transparent conductive oxide (TCO), metal, or a TCO/metal bilayer (wherein a thin metal layer may be deposited on the TCO to enhance the bonding quality if necessary). A top electrode 708 is also formed on the LED 704, wherein the top electrode may be formed from the same or different electrode materials with respect to the contact electrode 706. Depending on whether a metal (opaque) or a TCO (transparent) material is used as the top and/or bottom electrode, the display may be top emitting, bottom emitting, or both.

It will also be noted that the handle layer used for spalling (e.g., layer 306 of FIGS. 3 and 4, not shown in FIG. 7) may or may not be removed from the top of the active matrix after bonding.

Figure 8:
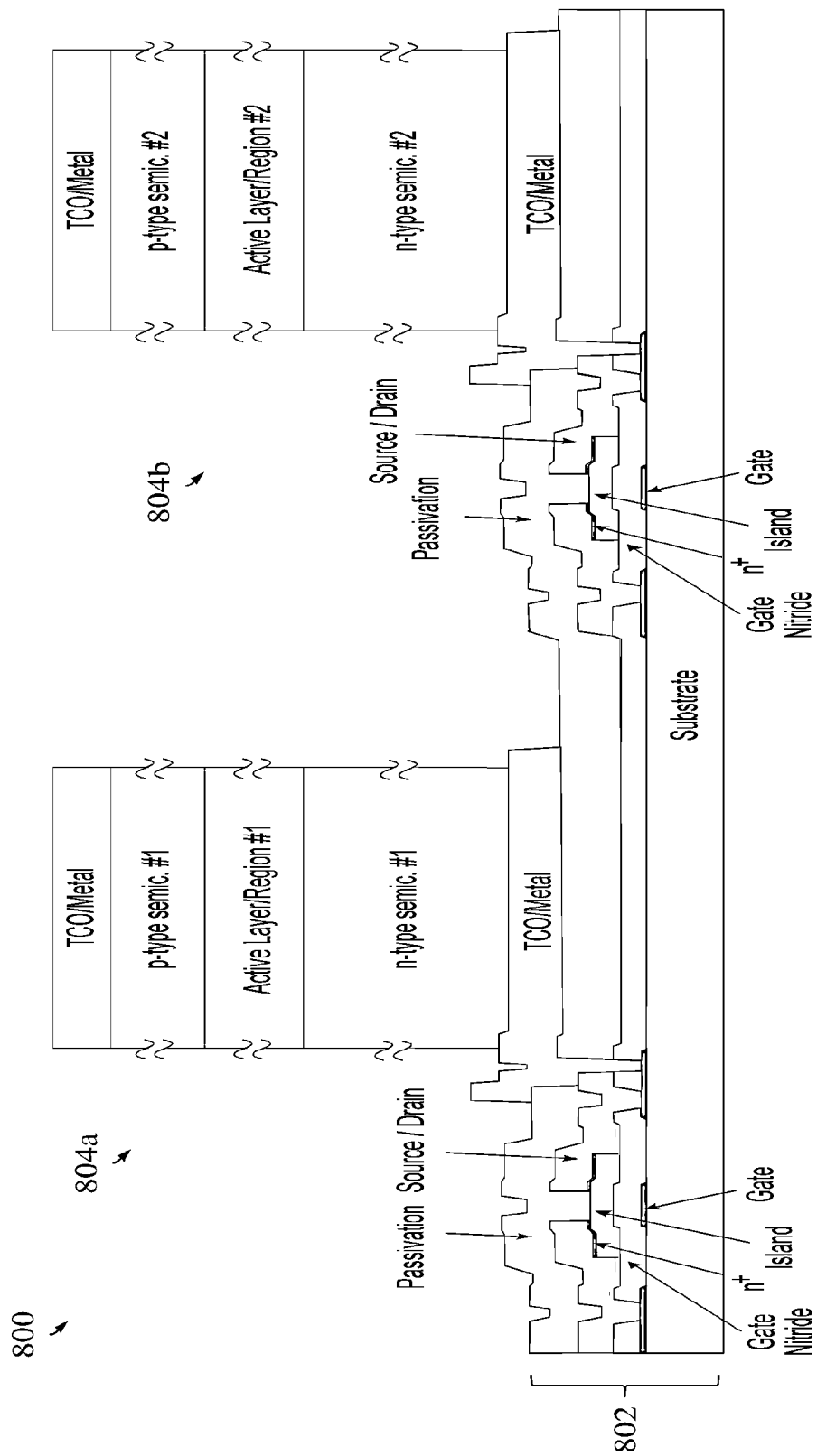
FIG. 8 is a cross sectional view illustrating multiple patterned inorganic LED devices bonded to an active matrix TFT backplane array for subpixel definition.

As stated earlier, once bonded to the backplane, the LED layer may be patterned, followed by repeating the spalling/bonding/patterning procedure for a different LED layer to create an adjacent pixel with a different light-emission color such as depicted by the active matrix LED array 800 of FIG. 8. Here, the active matrix TFT backplane 802 has a first patterned LED 804*a* and a second patterned LED 804*b*, where the LEDs 804*a*, 804*b* have different types of semiconductor materials that may be selected to provide two different color emissions. As should be appreciated, still an additional LED device(s) may be formed on the backplane 802 in addition to LEDs 804*a*, 804*b*, to define a single subpixel, such as for an RGB or RGBW color display. Although manufacture of the array 800 is more complex in terms of the number of processing steps, the individual LED materials provide an energy efficiency advantage, in that no color filtering is needed.

In lieu of patterning and repeating LED layer spalling and bonding, a single transferred LED layer may serve as the basis of a display, in which the LED layer remains unpatterned on the backplane. As depicted in the active matrix LED array 900 of FIG. 9, the active matrix TFT backplane 902 has a single or blanket LED structure 904 bonded thereto, such as described above. Color filters 906a and 906b are provided over the top side of the LED structure 904 opposite the backplane substrate in accordance with a top-emission display. Here, patterning is not necessary due to the nature of conduction of the LED, in that there is poor lateral conduction through the LED semiconductor layers. Again, it will be appreciated that although FIG. 9 depicts a pair of color filters 906a, 906b, three or more such color filters could be used to form a single pixel structure.

Figure 9:
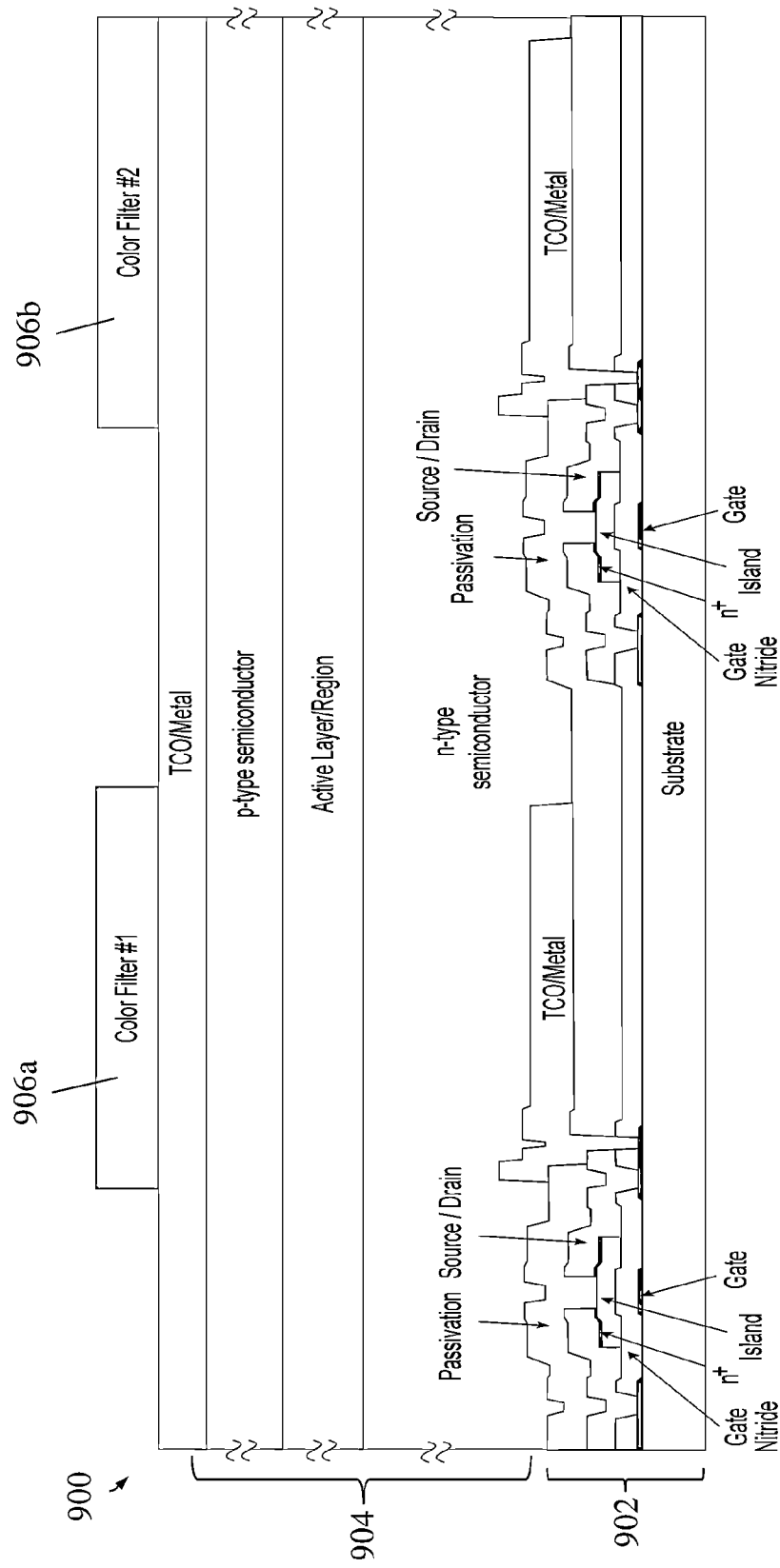
FIG. 9 is a cross sectional view of a single inorganic LED device bonded to an active matrix TFT backplane array, using color filters for subpixel definition.
Figure 10:
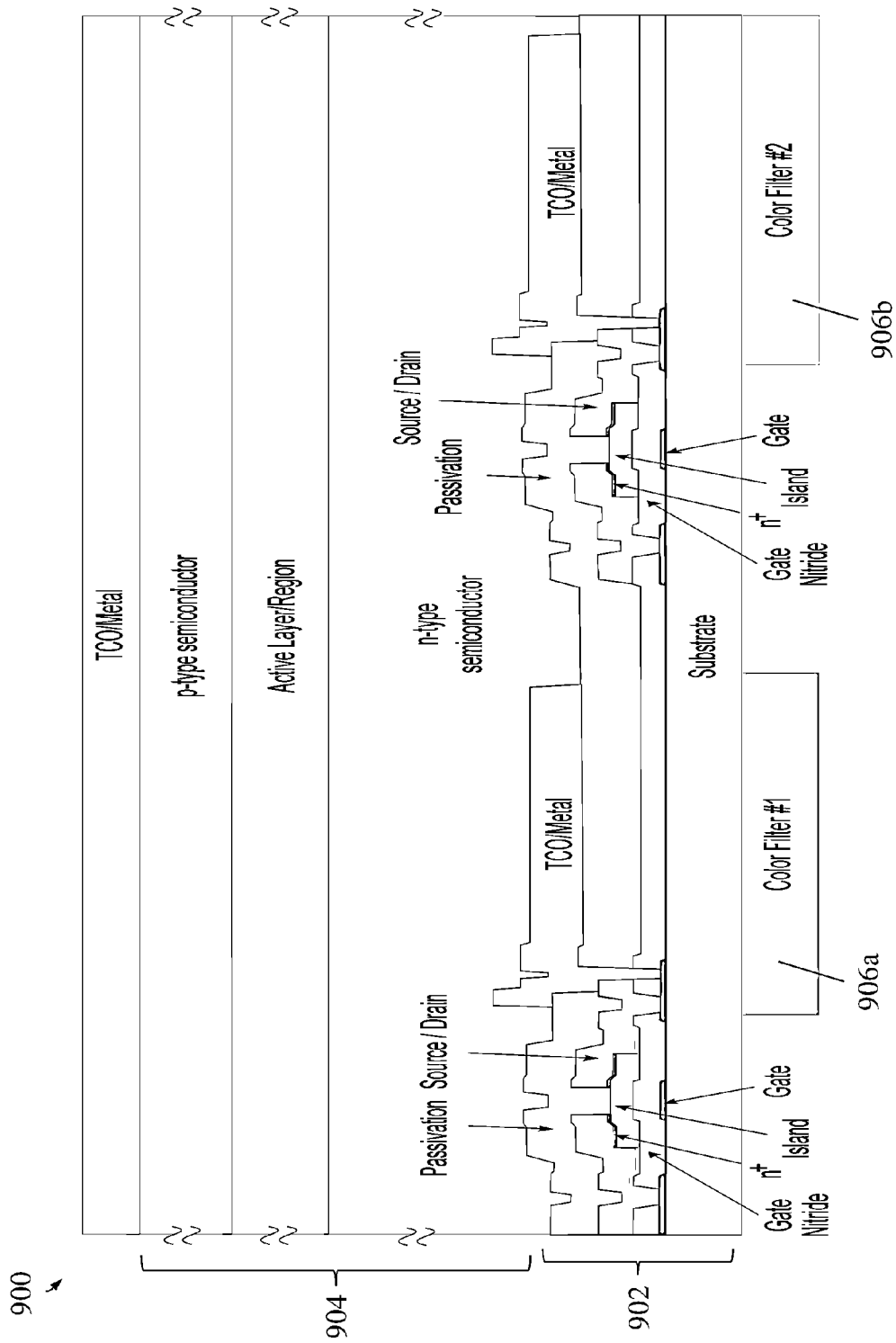
FIG. 10 is a cross sectional view of an alternative embodiment of a single inorganic LED device bonded to an active matrix TFT backplane array, using color filters for subpixel definition.

Finally, FIG. 10 illustrates an alternative embodiment of the array of FIG. 9, in which for a bottom-emission display, the color filters 906a, 906b are located at the bottom of the backplane 902. Still another alternative may include a double-sided emission (bifacial) display, in which color filters are located on both sides of the display. In any case, additional passivating/protecting/optical layers (not shown) as known in the art may be located between the color filters and the TCO/metal (on the top) and the substrate (on the bottom).

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. An active matrix, light emitting diode (LED) array, comprising:
    a first subpixel unit having layer of a first inorganic LED material bonded to an active matrix, thin film transistor (TFT) backplane array; and
    a second subpixel unit having a layer of a second inorganic LED material bonded to the active matrix, TFT backplane array; the first inorganic LED material is different from the second inorganic LED material, the first subpixel unit having a different light emission characteristic than the second subpixel unit.

2. The array of claim 1, further comprising a plurality of color filters formed on at least one of a top and bottom surface of the active matrix TFT backplane array.

3. The array of claim 1, wherein the inorganic LED material comprises gallium nitride (GaN).

4. The array of claim 1, further comprising a bottom contact electrode disposed between the backplane array and the inorganic LED material.

5. The array of claim 4, wherein the bottom contact electrode is one or more of: a transparent conductive oxide (TCO), a metal, and a TCO/metal bilayer.

6. The array of claim 5, further comprising a top contact electrode formed on a top surface of the inorganic LED material.

7. The array of claim 6, wherein the top contact electrode is one or more of: a transparent conductive oxide (TCO), a metal, and a TCO/metal bilayer.

8. The array of claim 1, wherein the layer of inorganic LED material is attached to a flexible handle layer, the flexible handle layer being configured to facilitate a spalling process within the inorganic LED material that exfoliates the inorganic LED material from a base substrate by application of a mechanical force on the flexible handle layer.

9. The array of claim 8, wherein the flexible handle layer comprises a polyimide material.

10. The array of claim 8, further comprising one or more stress layers formed between the inorganic LED material and the flexible handle layer.

11. The array of claim 10, further comprising an adhesion layer that forms an interface between the inorganic LED material and the one or more stress layers.

12. The array of claim 11, wherein the one or more stress layers comprise metal.

13. The array of claim 12, wherein a thickness of the one or more stress layers is selected so as exfoliate the inorganic LED material from the base substrate at a desired location with respect to thickness of the exfoliated inorganic LED material.

* * * * *